US 6,473,872 B1

(12) United States Patent
Hoffman

(10) Patent No.: US 6,473,872 B1
(45) Date of Patent: Oct. 29, 2002

(54) ADDRESS DECODING SYSTEM AND METHOD FOR FAILURE TOLERATION IN A MEMORY BANK

(75) Inventor: Helge Hoffman, Colchester, VT (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/520,549

(22) Filed: Mar. 8, 2000

(51) Int. Cl.[7] .............................................. G11C 29/00
(52) U.S. Cl. .................... 714/718; 365/200; 714/710
(58) Field of Search ................... 714/718, 710; 365/200

(56) References Cited

U.S. PATENT DOCUMENTS

| 5,657,279 | A |   | 8/1997 | Savignac et al. |
| 5,831,916 | A |   | 11/1998 | Berger |
| 6,199,187 | B1 | * | 3/2001 | Tamura et al. ............... 714/763 |
| 6,363,020 | B1 | * | 3/2002 | Shubat et al. ................ 365/200 |

* cited by examiner

Primary Examiner—Phung M. Chung
(74) Attorney, Agent, or Firm—Stanton Braden

(57) ABSTRACT

The present invention discloses a row address decoding system and method for tolerating failures on a pair of wordlines in a memory bank by separately addressing the pair of defective wordlines and replacing the defective wordlines with redundant wordlines in a redundancy block associated with the memory bank. The system of the invention includes a first decoder for decoding the row address signal to generate a first signal addressing wordlines in a first half of the memory bank, and a second decoder for decoding the row address signal with fuse data corresponding to status of fuses associated with wordlines in the memory bank to generate a second signal addressing wordlines in a second half of the memory bank, wherein the first and second signals respectively select first and second wordlines at the same time, and the first and second wordlines are in the first half and the second half of the memory bank, respectively. The system also includes a redundancy block associated with the memory bank, for storing redundant wordlines to be replaced with defective wordlines in the memory bank, wherein one of the redundant wordlines is addressed by the row address signal and replaced with one of the defective wordlines, the defective wordline is addressed by one of the first and second signals.

15 Claims, 3 Drawing Sheets

ADDRESS DECODING SYSTEM AND METHOD FOR FAILURE TOLERATION IN A MEMORY BANK

FIELD OF THE INVENTION

The present invention relates to an address decoding system and method for decoding an address signal to address components in a memory bank, and more particularly to an address decoding system and method for separately addressing a pair of defective components in a memory bank to replace the defective components with redundant components.

BACKGROUND OF THE INVENTION

Generally, dynamic random access memories (DRAMs) are organized in a bank structure of two-dimensional cells in rows and columns. Memory cells may be accessed via wordlines and bit lines. The wordlines are driven from row paths, and the bit lines run across a memory bank. Each cross point realizes an access to cell information of each cell connected to a selected wordline.

To achieve a high yield efficiency, each memory bank is provided with a redundancy block having redundant wordlines for replacement of defective wordlines in the memory bank. Each redundancy block associated with each memory bank also has an independent sense amplifier system.

FIG. 1 illustrates a common structure of a DRAM bank 10 including a redundancy block 11. The advantage of using a redundancy block 11 is to make it possible to repair defective wordlines in a memory bank 10 on which failures have occurred during or prior to testing a memory chip. All redundant wordlines may be concentrated in a redundancy block 11 next to memory blocks 12. In such configuration, it is possible to control the redundancy block 11 and the memory blocks 12 independently. Referring to FIG. 1, a conventional row address decoder 14 receives an n-bit row address signal ADD<n> for addressing wordlines in a memory bank 10. The row address signal ADD<n> can also address the redundant wordlines in the redundancy block 11.

Since DRAM is usually configured to a shared row address decoding architecture, a pair of wordlines WLm and WLn in the memory bank 10 are addressed by the row address signal ADD<n>. The pair of wordlines are typically addressed together at the same time. In other words, the pair of wordlines WLm and WLn cannot be addressed separately with the row address signal ADD<n> decoded by the row address decoder 14. Thus, if there are failures on both the wordlines WLm and WLn in the memory bank 10, the defective wordlines WLm and WLn cannot be replaced with two redundant wordlines in the redundancy block 11 because sense amplifiers associated with the redundancy block 11 can only support data sensing of a single wordline at a time. As a result, the memory bank 10 becomes unrepairable.

FIG. 2 shows a more detailed illustration of addressing wordlines with the n-bit row address signal ADD<n>. For example, in a memory chip with the size of 64M or more, a row address decoder requires a two-dimensional scheme. That is, the row address decoder 14 has an X-decoder 16 and a Y-decoder 18 for outputting an X-signal X<m> and a Y-signal Y<n-m>, respectively, by decoding the row address signal ADD<n>. It is assumed that the n-bit row address signal ADD<n> consists of m-bit X-data corresponding to the X-signal X<m> and (n-m)-bit Y-data corresponding to the Y-signal Y<n-m>. Each wordline in memory bank can be addressed with a combination of the X-signal X<m> and the Y-signal Y<n-m>. Thus, if one of a pair of wordlines in a memory bank, addressed by a row address signal, is defective, the row address decoder 14 decodes the row address signal to select the defective one of the pair of wordlines so that the defective wordline can be replaced with a redundant wordline addressed by the row address signal.

However, if failures occur on both the pair of wordlines that are addressed by the row address signal at the same time, the two defective wordlines cannot be replaced with two different redundant wordlines because the redundancy block structure allows only one selected redundant wordline at a time. That is, only one of the pair of defective wordlines can be replaced with one redundant wordline at a time. Thus, in a conventional row address decoding system, a memory bank becomes unrepairable if a pair of wordlines sharing a row address in the bank are defective.

Therefore, a need exists for an address decoding system that can decode a row address signal shared by a pair of wordlines in a memory bank to address the pair of wordlines separately, so that if the pair of wordlines are defective, each defective wordline can be separately selected and replaced with different redundant wordlines in a redundancy block.

SUMMARY OF THE INVENTION

The present invention provides an address decoding system and method for tolerating failures on wordlines in a memory bank that are addressed by a common row address signal. The system of the present invention includes a first decoder for decoding the row address signal to generate a first signal addressing wordlines in a first half of the memory bank, and a second decoder for decoding the row address signal with fuse data corresponding to status of fuses associated with wordlines in the memory bank to generate a second signal addressing wordlines in a second half of the memory bank, wherein the first and second signals respectively select first and second wordlines at the same time, and the first and second wordlines are in the first half and the second half of the memory bank, respectively. The system also includes a redundancy block associated with the memory bank, for storing redundant wordlines to be replaced with defective wordlines in the memory bank, wherein one of the redundant wordlines is addressed by the row address signal and replaced with one of the defective wordlines, and the defective wordline is addressed by one of the first and second signals. When the row address signal has m-bit X-data and (n-m)-bit Y-data, the first decoder may include $m^2$ decoding units each of which performs predetermined logic with respect to the m-bit X-data, wherein the first signal generated by the first decoder addresses a set of $m^2$ wordlines in the first half of the memory bank. In particular, each of the decoding units includes a logic circuit for performing a predetermined logic operation with respect to the m-bit X-data, and a transmission gate controlled by a set signal provided from an external source, for receiving an output of the logic circuit to generate a signal to address one of the $m^2$ wordlines of the first half of the memory bank. The second decoder may also include $m^2$ decoding units each of which performs a predetermined logic with respect to the m-bit X-data and p bits of the fuse data, wherein the second signal generated by the second decoder addresses a set of $m^2$ wordlines in the second half of the memory bank, and the p bits of the fuse data are corresponding to p blown fuses. In particular, each of the decoding units includes means for performing a predetermined logic operation with respect to the m-bit X-data and the p-bit fuse data, and at least one transmission gate controlled by a set signal provided from an external source, for receiving outputs from the means for performing a predetermined logic operation to generate a signal to address one of the $m^2$ wordlines in the second half of the memory bank.

The address decoding method of the present invention includes decoding the row address signal to address wordlines in a first half of the memory bank, and decoding the row address signal with fuse information to address wordlines in a second half of the memory bank, wherein the fuse information is determined by a status of fuses associated with wordlines in the memory bank, and the row address signal addresses a pair of wordlines in the memory bank at the same time, and first and second wordlines of the pair of wordlines are in the first half and the second half of the memory bank, respectively. The method may also include the steps of providing redundant wordlines to be replaced with defective wordlines in the memory bank, selecting one of the redundant wordlines that is addressed by the row address signal, and replacing one of the pair of wordlines with the selected redundant wordline, wherein the one of the pair of wordlines is defective. When the row address signal is n-bit data having m-bit X-data and (n-m)-bit Y-data, the step of decoding the row address signal may include the steps of decoding the m-bit X-data of the row address signal, and generating a first set of X-signals for addressing $m^2$ wordlines in the first half of the memory bank. The step of decoding the row address signal with fuse information may also include the steps of decoding the m-bit X-data with the fuse information, and generating a second set of X-signals for addressing $m^2$ wordlines in the second half of the memory bank.

BRIEF DESCRIPTION OF THE DRAWINGS

This disclosure will present in detail the following description of preferred embodiments with reference to the following figures wherein.

DESCRIPTION OF THE PREFERRED EMBODIMENTS

The present invention discloses an address decoding system and method for tolerating failures of components in a memory bank by replacing defective components with redundant components in a redundancy block associated with the memory bank. In one embodiment, defective components include defective wordlines in a memory bank which may be a pair of wordlines sharing a common row address signal. To accommodate toleration failures on a pair of wordlines in a memory bank accompanied by a redundancy block, it is necessary to separate the pair of defective wordlines so that each of the pair of wordlines can be selected separately. Thereby, each of the pair of wordlines can be replaced with a redundant wordline in a redundancy block at a separate time. Thus, the address decoding system and method of the present invention decodes a row address signal to separately select each of the pair of the defective wordlines in a memory bank, so that the selected wordline can be replaced with a redundant wordline. In decoding the row address signal, the present invention uses fuse information representing a status of fuses associated with the wordlines in a memory bank.

Figure 1:
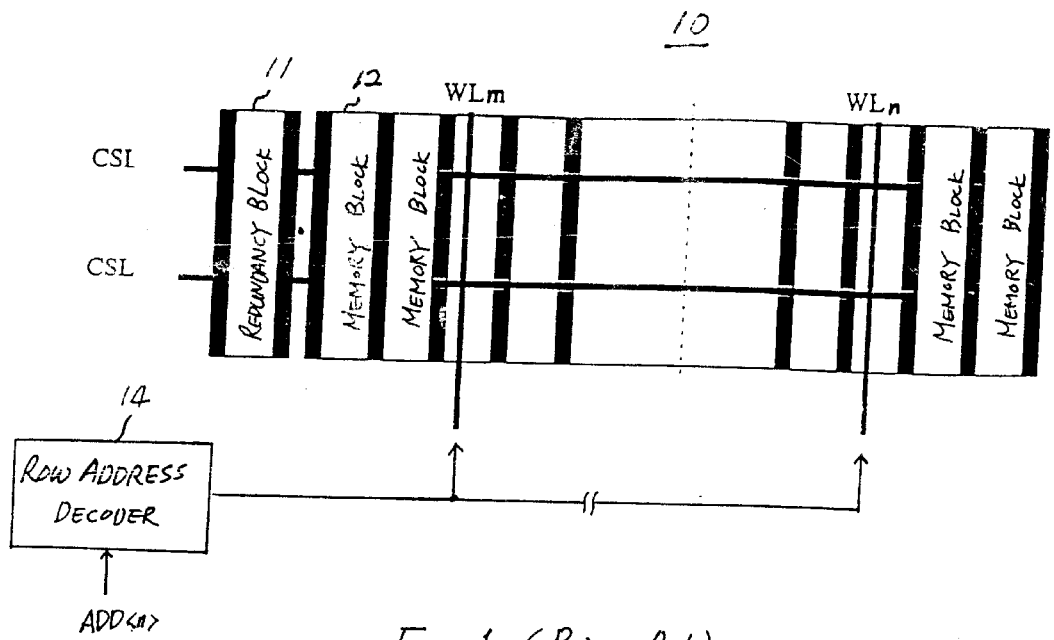
FIG. 1 is a block diagram illustrating an addressing scheme of a memory bank by a conventional row address decoder.
Figure 2:
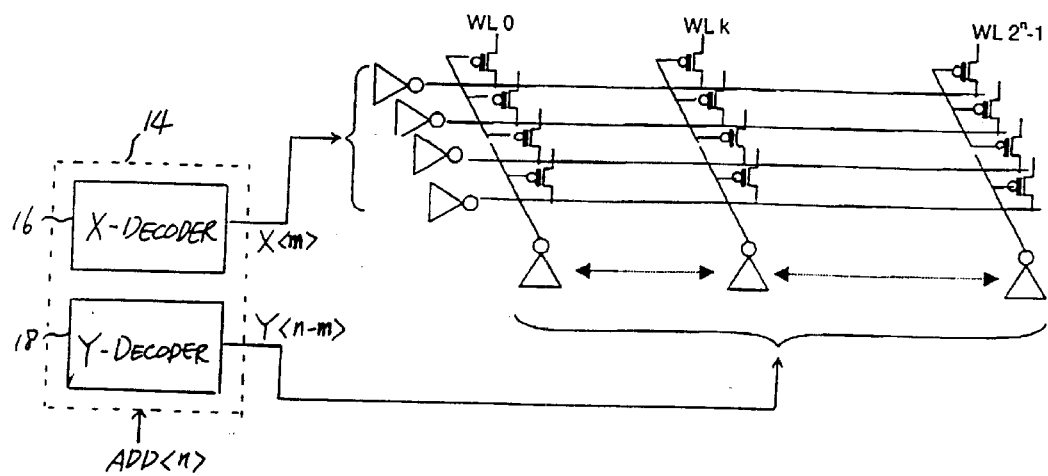
FIG. 2 is a more detailed illustration of addressing wordlines in the memory bank of FIG. 1.
Figure 3:
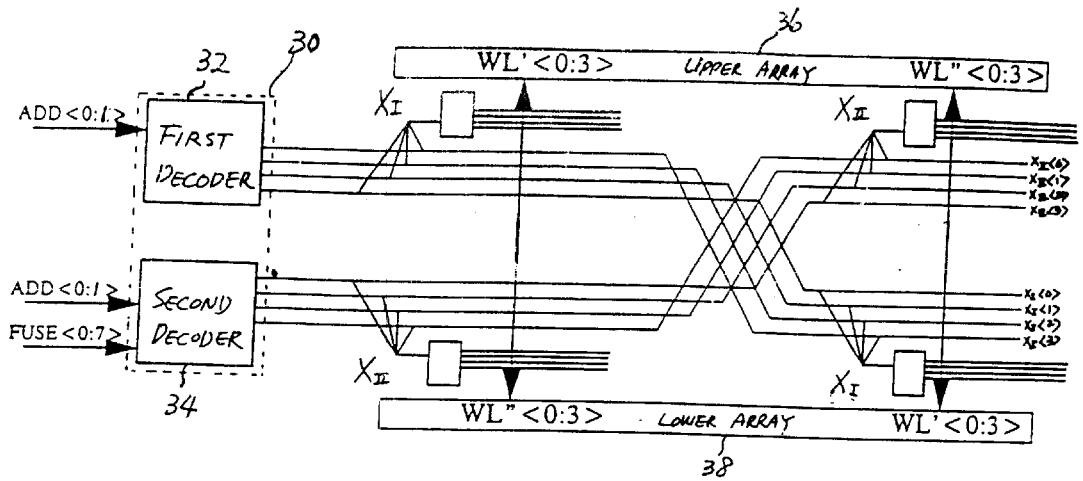
FIG. 3 is an illustration of addressing wordlines in a memory bank by use of an address decoding system of the present invention.

Referring to FIG. 3, an address decoding system of the present invention is illustrated with respect to decoding X-data of a row address signal to generate X-signals addressing wordlines in a memory bank. Assuming that a DRAM is configured to a shared row address decoding architecture, a memory bank has an upper array 36 and a lower array 38 and wordlines in the upper and lower arrays are driven in parallel. That is, a pair of wordlines in the upper array 36 are addressed by a row address signal at the same time, and a pair of wordlines in the lower array 38 are addressed by another row address signal at the same time. Each array is provided with a redundancy block having redundant wordlines to be replaced with defective wordlines in the array. It is assumed that the X-data of the row address signal is 2-bit data and fuse information is 8-bit data. Other address sizes may also be used.

A first decoder 32 and a second decoder 34 are included in a X-decoder 30 of the address decoding system of the present invention. The first decoder 32 receives the X-data, i.e., two least significant bits (LSBs) of the row address signal ADD<0:1>, and decodes the X-data ADD<0:1> to generate a first set of X-signals $X_I$. Since the X-data is two LSBs, the first set of X-signals are four X-signals $X_I$<0> –$X_I$<3>. The second decoder 34 decodes the X-data ADD<0:1> with 8-bit fuse data FUSE<0:7> to generate a second set of X-signals $X_{II}$ that are also four X-signals $X_{II}$<0> –$X_{II}$<3>. The fuse data FUSE<0:7> is determined by status of fuses associated with wordlines in a memory bank. Since the second set of X-signals $X_{II}$ is hard-coded with the fuse data FUSE <0:7>, the row address signal decoded by the X-decoder 30 can select a pair of wordlines the combination of which may be scrambled. That is, the decoded row address signal with the first set of X-signals $X_I$ can select one of a pair of wordlines, and the decoded row address signal with the second set of X-signals $X_{II}$ can select the other of the pair of wordlines.

In the upper array 36, wordlines in the left half are addressed by the decoded row address signal with the first set of X-signals $X_I$, and wordlines in the right half are addressed by the decoded row address signal with the second set of X-signals $X_{II}$. In a like manner, wordlines in the left half of the lower array 38 are addressed by the decoded row address signal with the second set of X-signals $X_{II}$, and wordlines in the right half of the lower array 38 are addressed by the decoded row address signal with the first set of X-signals $X_I$. Such wordline addressing scheme may be accomplished by a "twist" of the first and second sets of X-signals $X_I$ and $X_{II}$. That is, as shown in FIG. 3, the first set of X-signals $X_I$ is directed to address the wordlines in the left half of the upper array 36 and the right half of the lower array 38, and the second set of X-signals $X_{II}$ is directed to address the wordlines in the left half of the lower array 38 and the right half of the upper array 36. Thus, the decoded row address signal can address a pair of wordlines in an array such that one of the pair of wordlines is selected from the left half of the array and the other of the pair of wordlines is selected from the right half of the array, i.e., combination of the pair of wordlines is scrambled. An example of the scrambled combination in an array may be a combination of wordline WL'<0> in the left half of the array and wordline WL"<3> in the right half of the array. The wordlines WL'<0> and WL"<<3> are selected by use of X-signals $X_I$<0> and $X_{II}$<3>, respectively. Here, the scrambled combination is available only within a package of four wordlines in an array, because it is assumed that the X-data of the row address signal is two bits so that the four X-signals are generated from each of the first and second decoders 32 and 34. A detailed description of the first and second decoders 32 and 34 follows.

Figure 4:
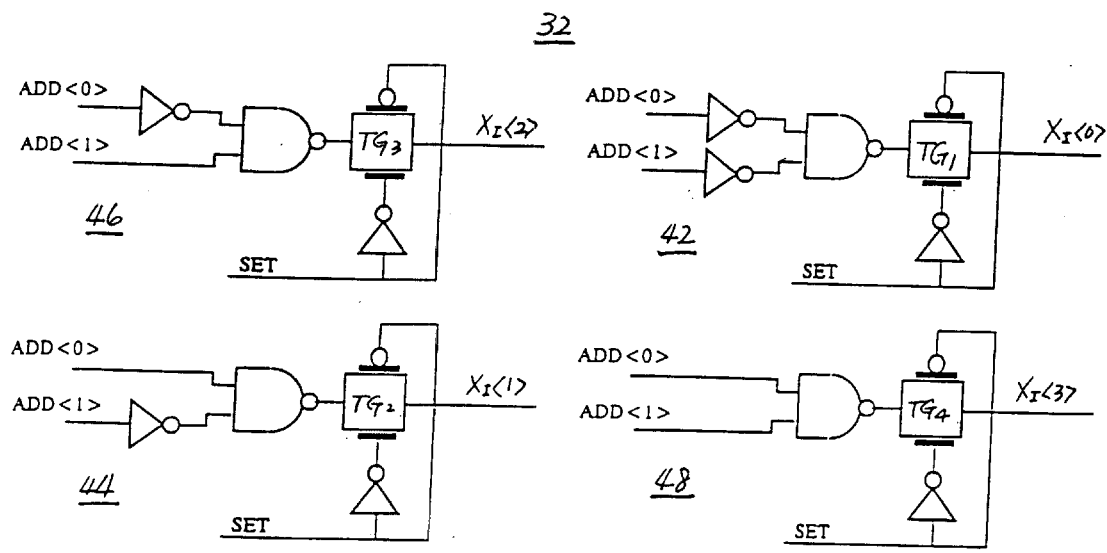
FIG. 4 is a logic circuit diagram illustrating a preferred embodiment of the first decoder in FIG. 3.

Referring to FIG. 4, a logic circuit diagram is illustrated for a preferred embodiment of the first decoder 32 in FIG. 3. Assuming that the 2-bit X-data ADD<0:1> is provided to the first decoder 32 to generate the first set of X-signals $X_I$, the first decoder 32 includes four decoding units 42–48 each of which receives the X-data ADD<0:1> and generates one of the first set of X-signals $X_I$<0> –$X_I$<3>. In a preferred embodiment, a first decoding unit 42 includes two inverters receiving two bits of the X-data ADD<0> and ADD<1>, respectively, a NAND gate performing logic NAND with respect to outputs of the two inverters, and a transmission gate $TG_1$ having input terminals for receiving an output of the NAND gate, a set signal SET, and an inverted set signal, and an output terminal to generate a first X-signal $X_I$<0> of the first set of X-signals $X_I$. The set signal SET is a gating signal, i.e., when the set signal SET becomes logic low, an output of the transmission gate becomes logic high. A second decoding unit 44 includes a NAND gate for performing logic NAND with respect to inputs, ADD<0> and inverted ADD<1>, and a transmission gate $TG_2$ for generating a second X-signal $X_I$<1>. The second transmission gate $TG_2$ has input terminals for receiving an output of the NAND gate, the set signal SET, and the inverted set signal. A third decoding unit 46 includes a NAND gate for performing logic NAND with respect to inputs, inverted ADD<0> and ADD<1>, and a transmission gate $TG_3$ for generating a third X-signal $X_I$<2>. A fourth decoding unit 48 also includes a NAND gate for performing logic NAND with respect to inputs, ADD<0> and ADD<I>, and a transmission gate $TG_4$ for generating a fourth X-signal $X_I$<3>. Since the first decoder 32 does not receive fuse data, the first set of X-signals $X_I$<0> –$X_I$<3> are not hard-coded with the fuse data. Other logic may also be used for the first decoder 32.

Figure 5:
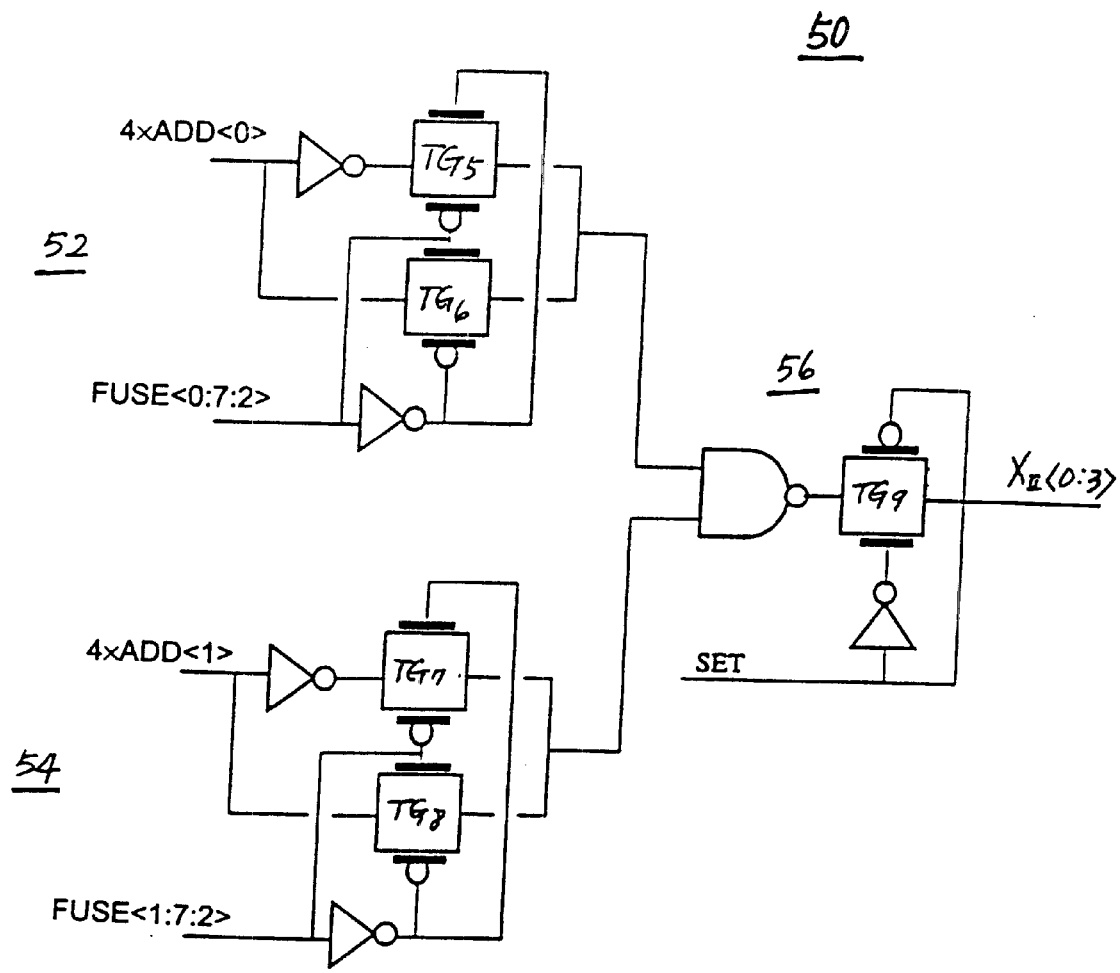
FIG. 5 is a logic circuit diagram illustrating a preferred embodiment of the second decoder in FIG. 3.

Referring to FIG. 5, a logic circuit diagram is illustrated for a preferred embodiment of the second decoder 34 in FIG. 3. Vectors are used illustratively in the inputs and the output of a decoding unit shown in FIG. 5. For this example, however, four instances of the decoding unit should be used, as in FIG. 4. Assuming that the 2-bit X-data and two bits of the fuse data corresponding two blown fuses are decoded to generate the second set of X-signals $X_{II}$, the decoding unit 50 includes three sub-decoding units 52–56 for generating one of the second set of X-signals $X_{II}$<0> –$X_{II}$<3>. In a preferred embodiment, a first sub-decoding unit 52 has two inverters receiving one bit of the X-data ADD<0> and one bit of the fuse data FUSE<0:7:2>, respectively, and two transmission gates $TG_5$ and $TG_6$ connected in serial to each other. For example, the fuse data FUSE<0:7:2> represents a range from "0" to "7" and an increment "2". That is, the fuse data input to the sub-decoding unit 52 may be one of FUSE<0>, FUSE<2>, FUSE<4>, and FUSE<6>. A transmission gate $TG_5$ has input terminals for receiving the inverted one bit X-data, the one bit fuse data FUSE<0:7:2>, and the inverted one bit fuse data, and an output terminal for generating an output signal to a third decoding unit 56. The other transmission gate $TG_6$ has input terminals for receiving the one bit X-data ADD<0>, the one bit fuse data FUSE<0:7:2>, and the inverted one bit fuse data, and an output terminal for generating an output signal to the third decoding unit 56. A second sub-decoding unit 54 also includes two inverters receiving one bit X-data ADD<1> and one bit fuse data FUSE<1:7:2>, respectively, and two transmission gates $TG_7$ and $TG_8$ connected in serial to each other. The fuse data FUSE<1:7:2> has a range from "1" to "7" and a increment "2". A transmission gate $TG_7$ has input terminals for receiving the inverted one bit X-data, the one bit fuse data FUSE<1:7:2>, and the inverted one bit fuse data, and an output terminal for generating an output signal to the third decoding unit 56. The other transmission gate $TG_8$ has input terminals for receiving the one bit X-data ADD<1>, the one bit fuse data FUSE<1:7:2>, and the inverted one bit fuse data, and an output terminal for generating an output signal to the third decoding unit 56. A third sub-decoding unit 56 has a NAND gate for receiving the output signals of the transmission gates $TG_5$–$TG_8$ of the first and second decoding units 52 and 54, an inverter receiving the set signal SET, and a transmission gate $TG_9$ having input terminals for receiving an output of the NAND gate, an output of the inverter, and the set signal SET, and an output terminal for generating one of the second set of X-signals $X_{II}$<0:3>, i.e., one of four X-signals $X_{II}$<0> –$X_{II}$<3>, depending on values of the X-data ADD<0> and ADD<1> and the fuse data FUSE<0:7:2> and FUSE<1:7:2>. Although having described the logic for the preferred embodiment, other logic may also be used for the second decoder 34.

Referring to FIG. 3 again, since the second decoder 34 decodes the X-data ADD<0:1> with the fuse data FUSE<0:7>, the second set of X-signals $X_{II}$<0:3> is hard-coded with the fuse data FUSE<0:7>. While the first decoder 32 decodes the X-data ADD<0:1> to generate the first set of X-signals $X_I$<0:3> addressing the wordlines in the left half of the upper array 36, the second decoder 34 decodes the X-data ADD<0:1> with the fuse data FUSE<0:7> to generate the second set of X-signals $X_{II}$<0:3> addressing the wordlines in the right half of the upper array 36. Thus, a row address signal decoded by the first and second decoders 32 and 34 can address a pair of wordlines in an array of which combination is scrambled, such as a combination of WL'<0> and WL"<3>. For example, assuming that there is a pair of wordlines WL<201> and WL<201+8k> in an array sharing a common row address data XXXX01, the array is unrepairabie in a conventional decoder if there are failures on both the wordlines WL<201> and WL<201+8k>. However, the decoding system of the present invention can separate the wordlines WL<201> and WL<201+8k> by use of fuse data associated with the wordlines WL<201> and WL<201+8k>.

Since the first and second sets of X-signals $X_I$ and $X_{II}$ decoded by the first and second decoders 32 and 34 can separately address wordlines in the left half and the right half of the array, respectively, the wordlines WL<201> and WL<201+8k> in the left half and right half of the array can be addressed separately. That is, the first and second decoders 32 and 34 decode the row address data XXXX01 to generate a first set of X-signals $X_I$ that addresses the wordline WL<201> in the left half of the array and a second set of X-signals $X_{II}$ that addresses, for example, a wordline WL<203+8k> in the right half of the array. Thus, assuming that the wordline WL<203+8k> has no failure, the wordline WL<201> can be replaced with a redundant wordline that is addressed by the row address data XXXX01. When row address data XXXX11 is applied, the first and second decoders 32 and 34 decode the row address data XXXX11 to address a pair of wordlines, such as WL<203> and WL<201+8k> in the left and right halves of the array, respectively. Thus, assuming that the wordline WL<203> does not fail, the wordline WL<201+8k> can be replaced with a redundant wordline that is addressed by the row address XXXX11. Therefore, the pair of defective wordlines WL<201> and WL<201+8k> in the array can be separately selected and replaced with the different redundant wordlines in a redundancy block. An example of the scrambled combination is illustrated in Table 1.

TABLE 1

| ADD <0:1> | $X_I$ | FUSE <0:7> | $X_{II}$ |
|---|---|---|---|
| XXXXX00 | 0 | <0>/<1> | 3 |
| XXXXX01 | 1 | <2>/<3> | 2 |
| XXXXX10 | 2 | <4>/<5> | 1 |
| XXXXX11 | 3 | <6>/<7> | 0 |

The first through the fourth columns of Table 1 respectively represent the row address data ADD<0:1> input to the first and second decoders 32 and 34, the first set of X-signals $X_I$ output from the first decoder 32, the fuse data FUSE <0:7> input to the second decoder 34, and the second set of X-signals $X_{II}$, output from the second decoder 34 which are hard-coded with the fuse data FUSE <0:7>. When the two LSBs of the row address data are "00", the first decoder 32 generates X-signal $X_I$<0>. In this case, assuming that fuses "0" and "1" are blown, the second decoder 34 generates X-signal $X_{II}$<3>. Thus, the different X-signals $X_I$<0> and $X_{II}$<3> make it possible that two different wordlines in a bank are separately addressed. In like manner, the second through the fourth rows of Table 1 show the scrambled combination of the X-signals. Therefore, a pair of defective wordlines in a memory bank can be separately addressed with a row address signal decoded by the decoding system of the present invention, and each defective wordline can be replaced with a redundant wordline selected by the row address signal.

Having described preferred embodiments of a row address decoding system and method according to the present invention, it is noted that modifications and variations can be made by persons skilled in the art in light of the above teachings. For example, although being described in terms of decoding X-data of a row address signal, the present invention is also applicable to decoding Y-data of a row address signal. That is, the fuse information can be hard-coded with the Y-data of the row address signal. It is therefore to be understood that, within the scope of the appended claims, the present invention can be practiced in a manner other than as specifically described herein.

What is claimed is:

1. A system for decoding a row address signal to address wordlines in a memory bank, comprising:
    a first decoder for decoding the row address signal to generate a first signal addressing wordlines in a first half of the memory bank; and
    a second decoder for decoding the row address signal with fuse data corresponding to status of fuses associated with wordlines in the memory bank to generate a second signal addressing wordlines in a second half of the memory bank,
    wherein the first and second signals respectively select first and second wordlines at the same time, the first and second wordlines being in the first half and the second half of the memory bank, respectively.

2. The system as defined in claim 1, further including a redundancy block associated with the memory bank, for storing redundant wordlines to be replaced with defective wordlines in the memory bank, wherein one of the redundant wordlines is addressed by the row address signal and replaced with one of the defective wordlines, the defective wordline being addressed by one of the first and second signals.

3. The system as defined in claim 1, wherein the row address signal has two-dimensional X-data and Y-data, the first decoder decodes the X-data of the row address signal, and the second decoder decodes the X-data of the row address signal with the fuse data.

4. The system as defined in claim 3, wherein the X-data is an m-bit data of the n-bit row address signal.

5. The system as defined in claim 4, wherein the first decoder includes $M^2$ decoding units each of which performs predetermined logic with respect to the m-bit X-data, the first signal generated by the first decoder addressing $m^2$ wordlines in the first half of the memory bank.

6. The system as defined in claim 5, wherein each of the decoding units includes:
    a logic circuit for performing, a predetermined logic operation with respect to the m-bit X-data; and
    a transmission gate controlled by a set signal provided from an external source, for receiving an output of the logic circuit to generate a signal to address one of the $m^2$ wordlines of the first half of the memory bank.

7. The system as defined in claim 4, wherein the second decoder includes $m^2$ decoding units each of which performs a predetermined logic with respect to the m-bit X-data and p bits of the fuse data, the second signal generated by the second decoder addressing $M_2$ wordlines in the second half of the memory bank, wherein the p bits of the fuse data are corresponding to p blown fuses.

8. The system as defined in claim 7, wherein each of the decoding units includes:
    means for performing a predetermined logic operation with respect to the m-bit X-data and the p-bit fuse data; and
    at least one transmission gate controlled by a set signal provided from an external source, for receiving outputs from the means for performing a predetermined logic operation to generate a signal to address one of the $m^2$ wordlines in the second half of the memory bank.

9. The system as recited in claim 1, wherein the system is included on a semiconductor memory chip.

10. A method for decoding a row address signal to address wordlines in a memory bank, comprising the steps of:
    decoding the row address signal to address wordlines in a first half of the memory bank; and
    decoding the row address signal with fuse information to address wordlines in a second half of the memory bank, the fuse information being determined by status of fuses associated with wordlines in the memory bank,
    wherein the row address signal addresses a pair of wordlines in the memory bank at the same time, first and second wordlines of the pair of wordlines are in the first half and the second half of the memory bank, respectively.

11. The method as defined in claim 10, further including the steps of:
    providing redundant wordlines to be replaced with defective wordlines in the memory bank;
    selecting one of the redundant wordlines that is addressed by the row address signal; and replacing one of the pair of wordlines with the selected redundant wordline, wherein the one of the pair of wordlines is defective.

12. The method as defined in claim 10, wherein the row address signal is n-bit data having m-bit X-data and (n-m)-bit Y-data, and the step of decoding the row address signal includes the steps of:

decoding the m-bit X-data of the row address signal; and generating a first set of X-signals for addressing $m^2$ wordlines in the first half of the memory bank.

13. The method as defined in claim 12, wherein the step of decoding the row address signal with fuse information includes the steps of:

decoding the m-bit X-data with the fuse information; and generating a second set of X-signals for addressing $m^2$ wordlines in the second half of the memory bank.

14. The method as defined in claim 13, wherein one of the first set of X-signals addresses the first wordline of the pair of wordlines, and one of the second set of X-signals addresses the second wordline of the pair of wordlines.

15. The method as recited in claim 10, wherein the memory bank is included on a semiconductor memory chip.

* * * * *